United States Patent
Nyseth et al.

[11] Patent Number: 5,915,562
[45] Date of Patent: Jun. 29, 1999

[54] TRANSPORT MODULE WITH LATCHING DOOR

[75] Inventors: David L. Nyseth, Plymouth; Dennis J. Krampotich, Shakopee, both of Minn.

[73] Assignee: Fluoroware, Inc., Chaska, Minn.

[21] Appl. No.: 08/891,645

[22] Filed: Jul. 11, 1997

Related U.S. Application Data

[63] Continuation-in-part of application No. 08/678,885, Jul. 12, 1996, Pat. No. 5,711,427.

[51] Int. Cl.⁶ .................................................. B65D 85/30
[52] U.S. Cl. ........................................... 206/710; 414/217
[58] Field of Search ..................................... 206/454, 710, 206/711, 722, 725, 832; 141/98; 414/219, 292, 404, 407; 220/323

[56] References Cited

U.S. PATENT DOCUMENTS

| | | |
|---|---|---|
| 4,534,389 | 8/1985 | Tullis . |
| 4,674,939 | 6/1987 | Maney et al. . |
| 4,739,882 | 4/1988 | Parikh et al. . |
| 4,815,912 | 3/1989 | Maney et al. . |
| 4,995,430 | 2/1991 | Bonora et al. .......................... 414/292 |
| 5,482,161 | 1/1996 | Williams et al. ........................ 414/217 |
| 5,555,981 | 9/1996 | Gregerson ............................... 206/711 |
| 5,628,683 | 5/1997 | Gentischer .............................. 414/217 |
| 5,711,427 | 1/1998 | Nyseth .................................... 206/710 |

FOREIGN PATENT DOCUMENTS

WO 90/14273  11/1990  WIPO .

*Primary Examiner*—David T. Fidei
*Attorney, Agent, or Firm*—Palmatier, Sjoquist, Voigt & Christensen, P

[57] ABSTRACT

A wafer container has an open front defined by a door receiving frame and a door sized for the door receiving frame. The door receiving frame has slots on opposite sides and the door utilizes latching linkages and lifting linkages cooperate to extend, lift, lower and retract the latching portions from the door into and out of latch receptacles on the door receiving frame. The door may also have passive wafer cushions or active wafer engaging arms which extend inwardly toward the wafers to secure said wafers when the door is in place. The latching linkages, lifting linkages, and where desired the retaining arms are linked to rotatable cammed members in the interiors if the door. The cammed member utilizes cammed surfaces configured to first extend the latching portions in a first direction into the latching receptacles and to then move the latching portions in a second direction normal to the first direction to pull the door inwardly and to seal the door to the container portion.

28 Claims, 17 Drawing Sheets

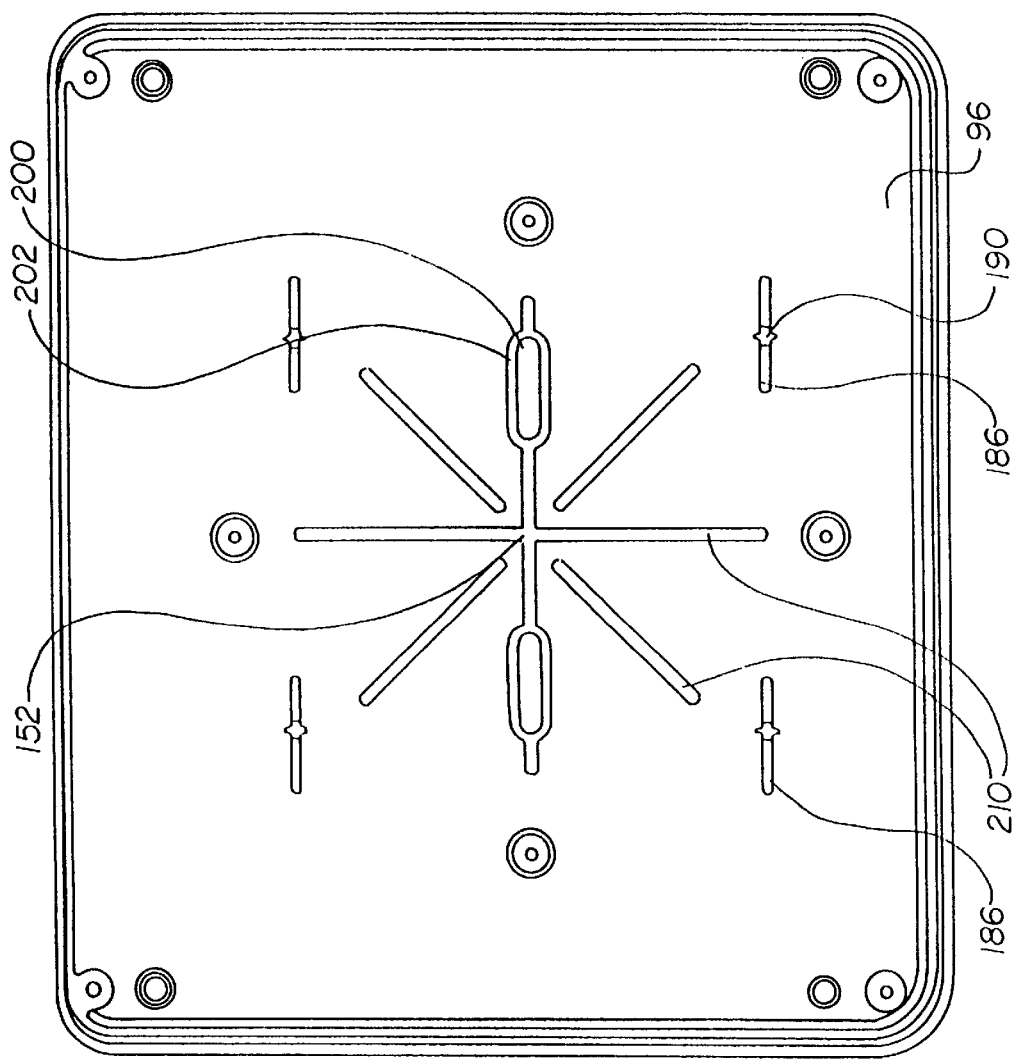
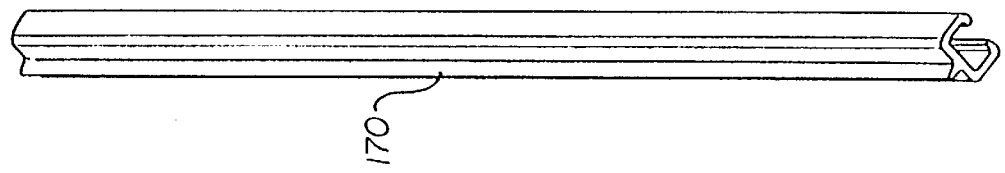

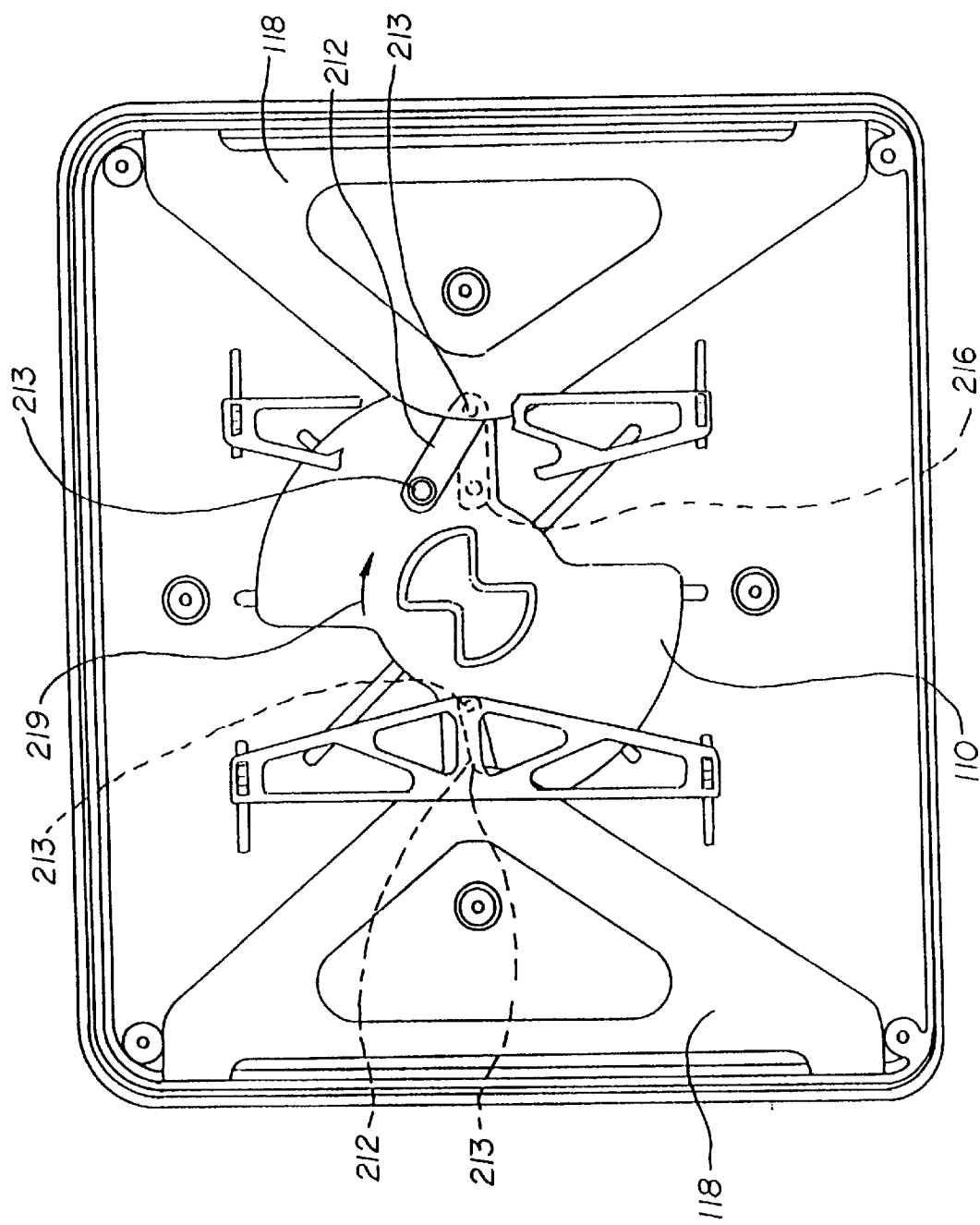

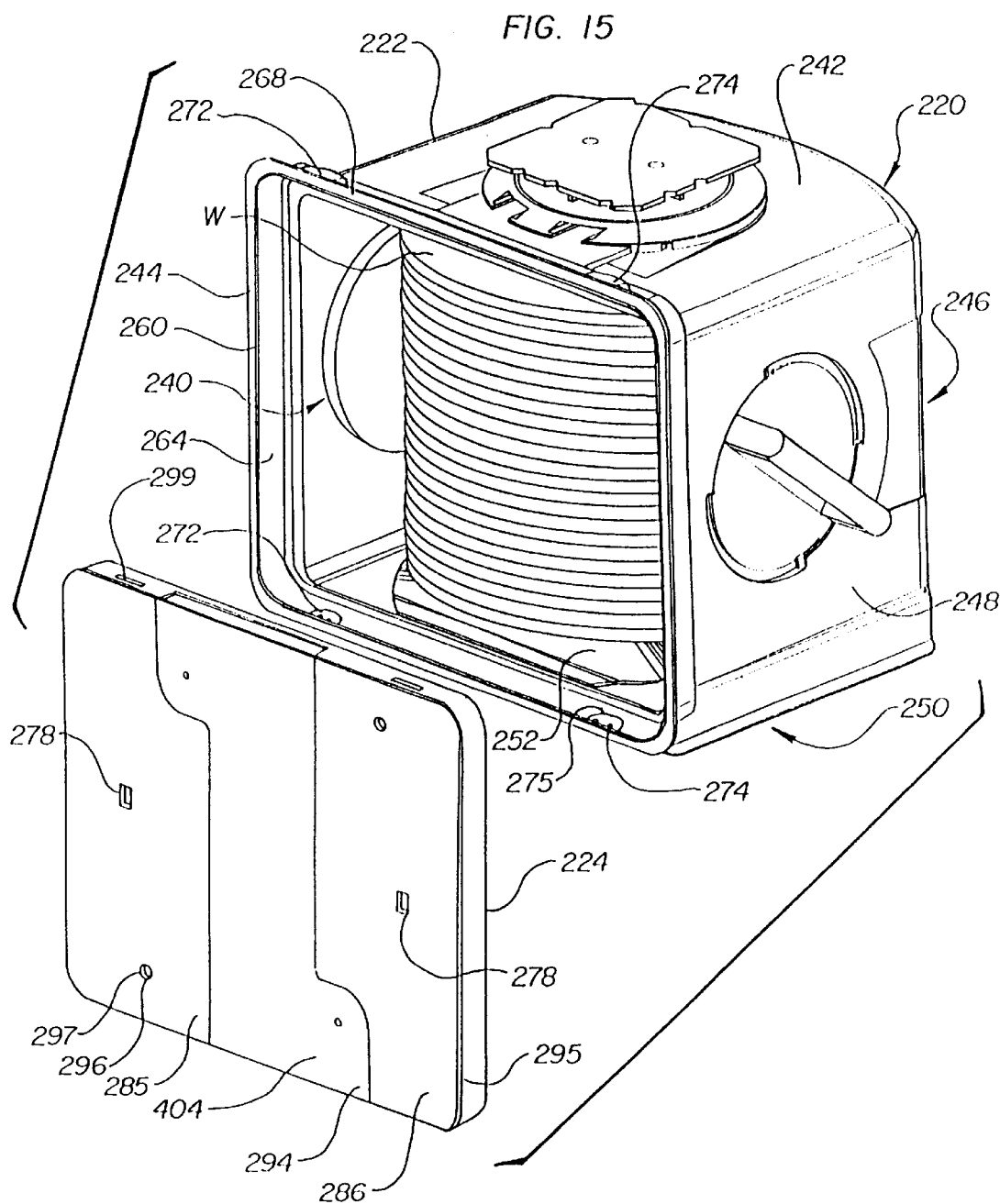

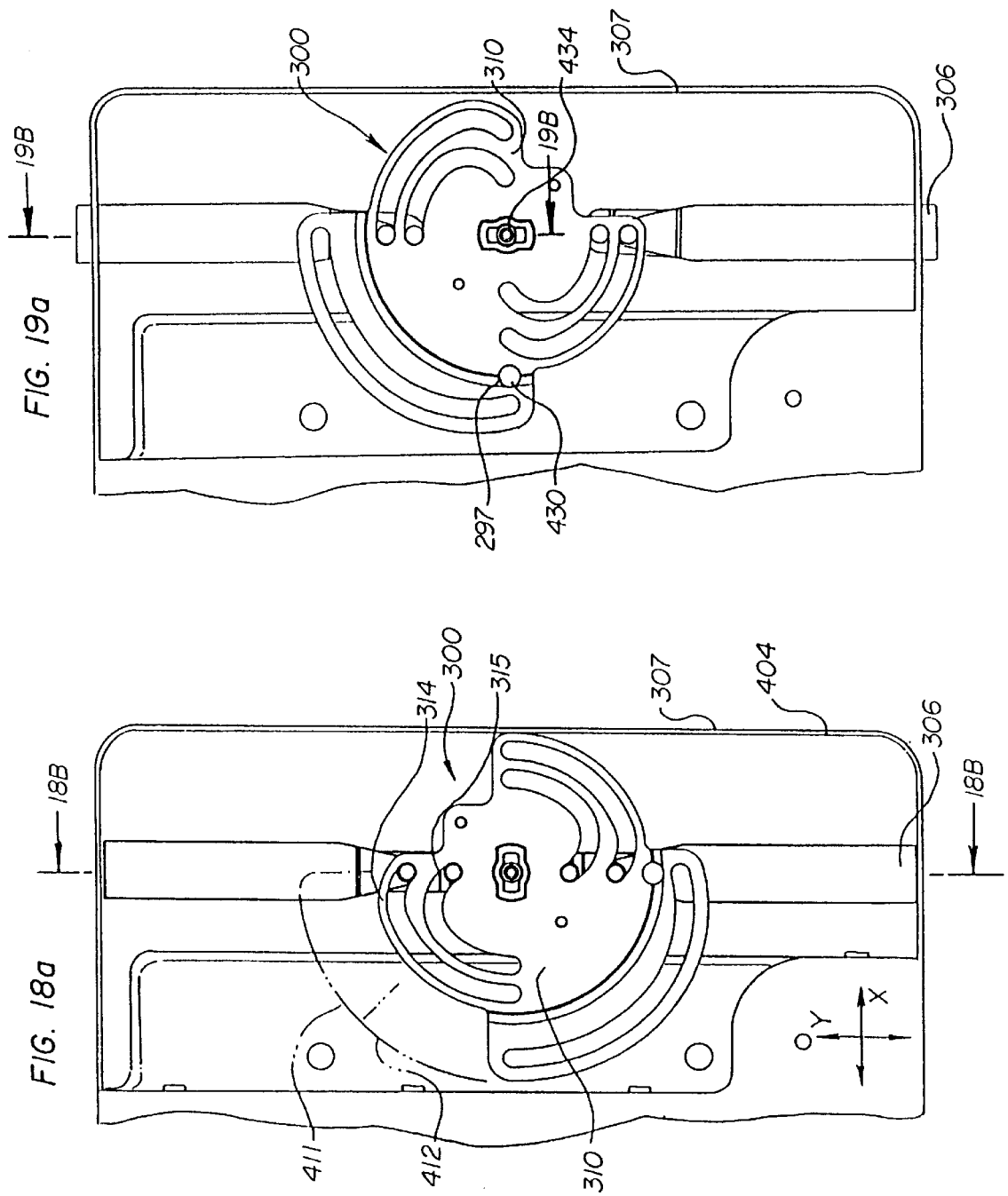

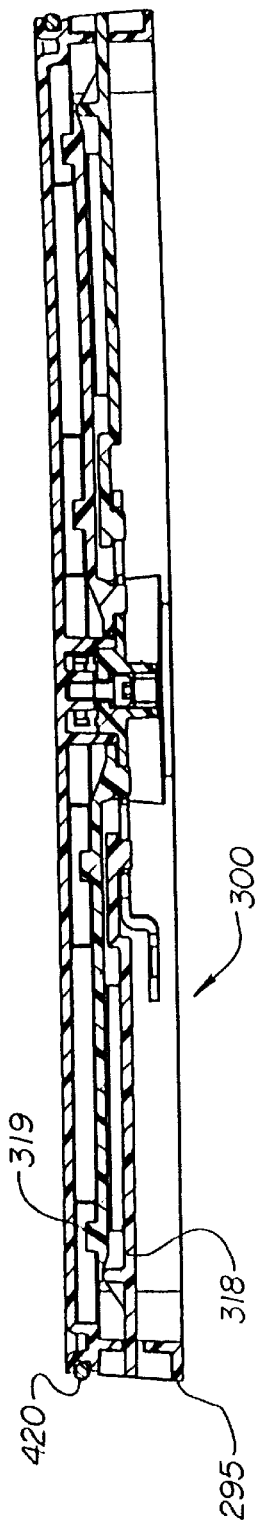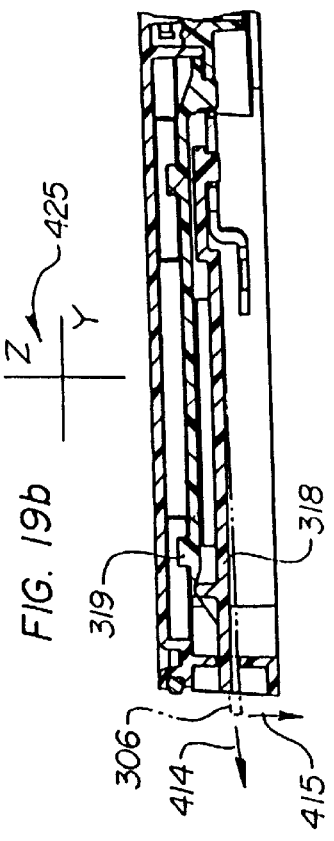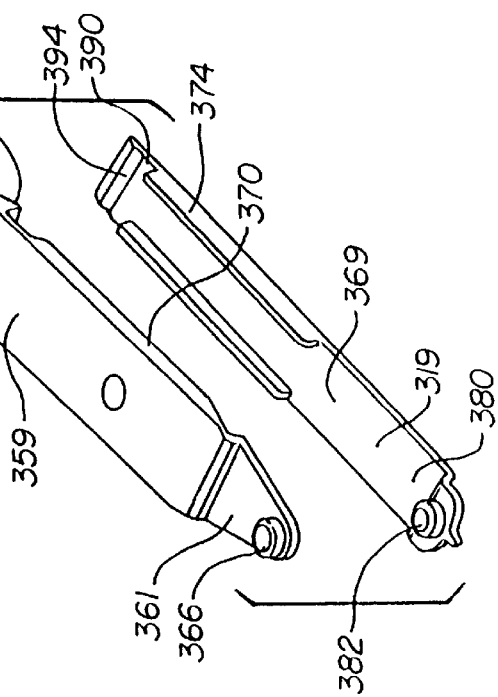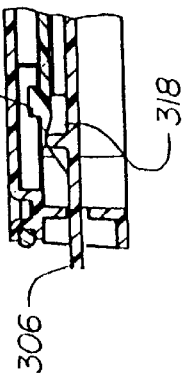

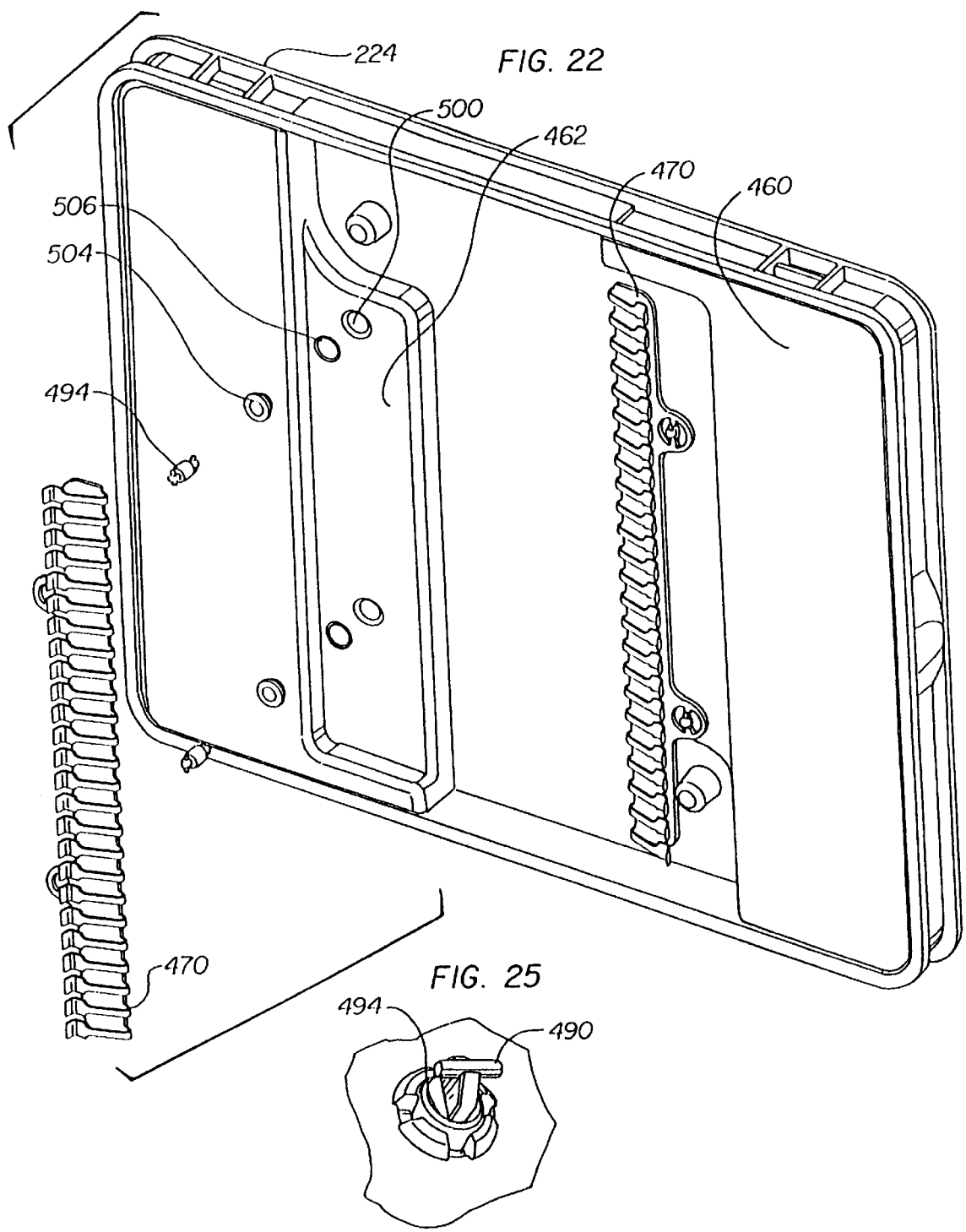

TRANSPORT MODULE WITH LATCHING DOOR

This application is a continuation-in-part application of application Ser. No. 08/678,885, filed Jul. 12, 1996, now U.S. Pat. No. 5,711,427.

BACKGROUND OF THE INVENTION

This invention relates to wafer carriers. More particularly it relates to wafer containers that have a cover or door to enclose the wafers in the container.

Various methods have been utilized to enclose wafers in containers for storage or shipping. Some containers have utilized vertical slots for the wafers and snap on top covers or lids of resiliently flexible plastic. In such carriers typically passive cushions attached to the top cover are deflected when engaging the wafers as the top cover was applied.

The semiconductor industry has evolved into processing larger wafers, up to 300mm in diameter, and is moving toward carriers and transport containers with exclusively horizontal wafer positioning. The larger containers necessary for holding the larger wafers make conventional passive resiliently flexible cushions difficult to fabricate and use.

The larger doors required for larger wafer carriers require secure latching mechanisms in the doors. Ideally, such mechanisms will be mechanically simple with few moving parts and no metal parts. The presence of any metal parts presents the possibility of generating metal particulates which can cause serious problems in semiconductor processing.

SUMMARY OF THE INVENTION

A wafer container has an open front defined by a door receiving frame and a door sized for the door receiving frame. The door receiving frame has slots on opposite sides and the door utilizes latching linkages that extend, lift, lower and retract the respective latching portions from the edge portion of the door into and out of latch receptacles on the door receiving frame. The door may also have passive wafer cushions or active wafer engaging arms which extend inwardly toward the wafers to secure said wafers when the door is in place. The latching linkages, lifting linkages, and where desired the retaining arms are linked to rotatable cammed members in the interiors of the door. The cammed member utilizes cammed surfaces configured to first extend the latching portions in a first direction into the latching receptacles and to then move the latching portions in a second direction normal to the first direction to pull the door inwardly and to seal the door to the container portion. Where desired a wafer retaining arm may also be extended.

An advantage and feature of the invention is that the latching mechanism utilized is comprised of a minimal member of component parts that are mechanically simple yet provide an effective and reliable latching action.

An advantage and feature of the invention is that the door also provides wafer retention in addition to latching of the door. Said latching and retention is provided by a single rotational motion of a door handle.

Another feature and advantage of the invention is that the mechanism is positioned in the interior of the door thereby minimizing the generation and dispersal of particles by the door mechanism.

Another feature and advantage of the invention is that the door mechanism provides the latching and wafer retention in an appropriate sequence.

Another feature and advantage of the invention is that the cammed surfaces in the rotatable cammed member may include a detent to easily and simply secure the door in the latched position and to secure the wafer retaining arm in the engagement position.

BRIEF DESCRIPTION OF THE DRAWINGS

FIG. 8 is a perspective view of a wafer engaging portion.

FIG. 9 is a front elevational view of the inside of the back panel of the door.

FIG. 14C is a plan view of an alternate embodiment.

FIG. 15 is a view of an alternate transport module.

FIG. 18A is a elevational view of the right side of the door of FIG. 17 with the covered removed.

FIG. 18B is a cross-sectional view taken at line 18B of FIG. 18A.

FIG. 19A is a elevational view of the right side of the door of FIG. 17 with the top panel removed.

FIG. 19B is a cross-sectional view taken at line 19B of FIG. 19A.

FIG. 20 is, a perspective view of a set of latching linkages.

FIG. 21 is a cross-sectional view generally showing the same view as FIGS. 18B and 19B with the latch portion in a different position.

FIG. 22 is a perspective view of the inside of the door revealing the wafer restraint devices.

FIG. 25 shows a detailed perspective view of the piston in place in a bushing in the enclosure wall.

DETAILED SPECIFICATION

Figure 1:
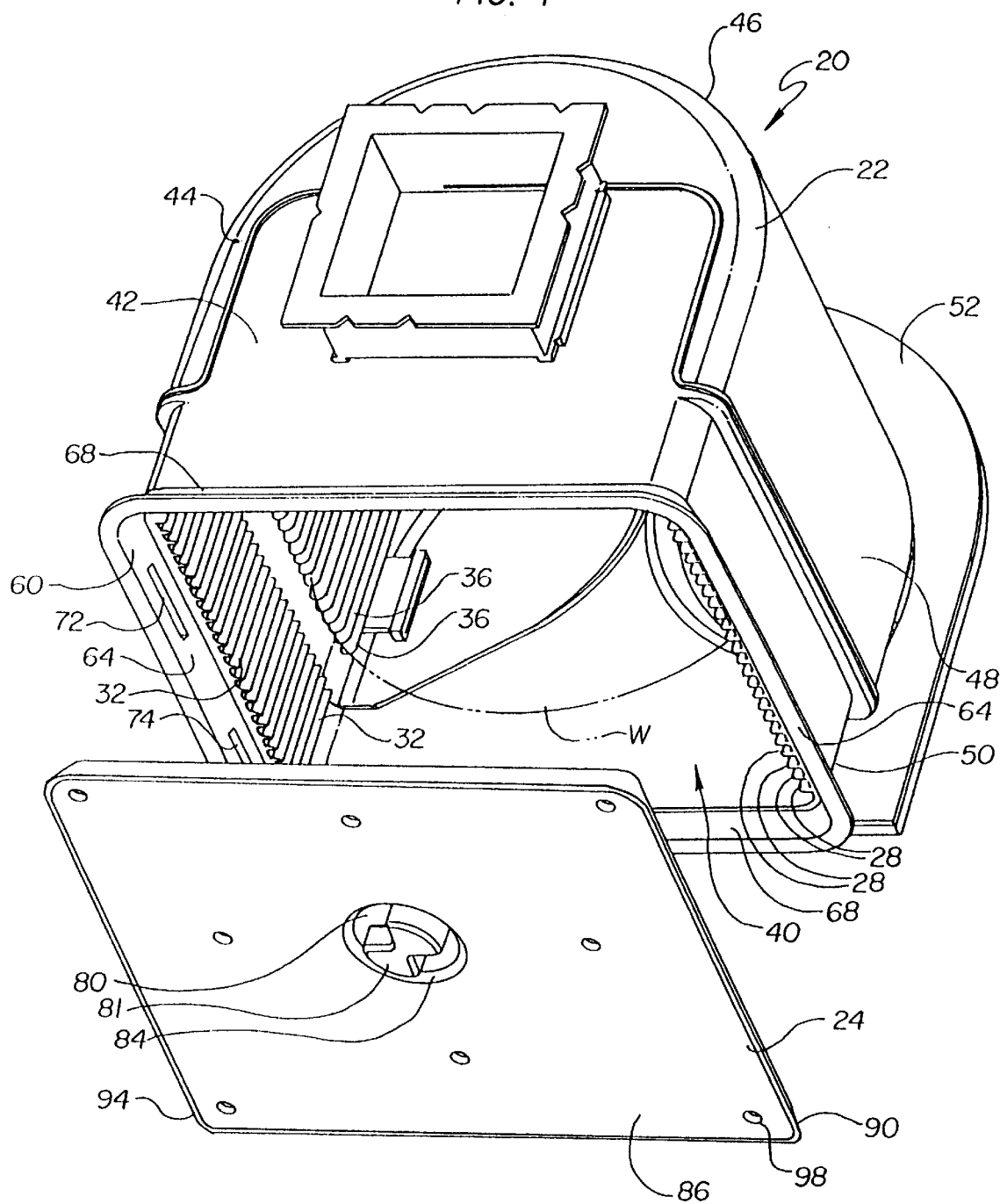
FIG. 1 is perspective view of a wafer container and door.

Referring to FIG. 1 a wafer container 20 generally comprised of a container portion 22 and a cooperating door 24 is shown. The container portion has a plurality of wafer slots 28 for insertion and removal of wafers W in substantially horizontal planes. The slots are defined by the wafer guides 32 and the wafer support shelves 36. The container portion generally has an open front 40, a closed top 42, a closed left side 44, a closed back side 46, and a closed right side 48 and a closed bottom 50. The container is shown positioned on an equipment interface 52.

The door 24 seats into and engages with a door receiving frame 60. Door frame 60 has two pairs of opposing frame members, a vertical pair 64 and a horizontal pair 68. The vertical frame members have a pair of apertures or slots 72, 74 which are utilized in engaging and latching the door to the container portion 22. The door has an active wafer retaining means as well as a latching means with the door. The door has a centrally located rotatable member 80 with a manual or robotic handle 81 set in a recess 84 in the front cover 86. The front cover 86 is part of the door enclosure 90 which also includes the door edge portion 94 and a back panel 96 not shown in this view. The front cover 86 is fastened with suitable mechanical fasteners 98.

Figure 2:
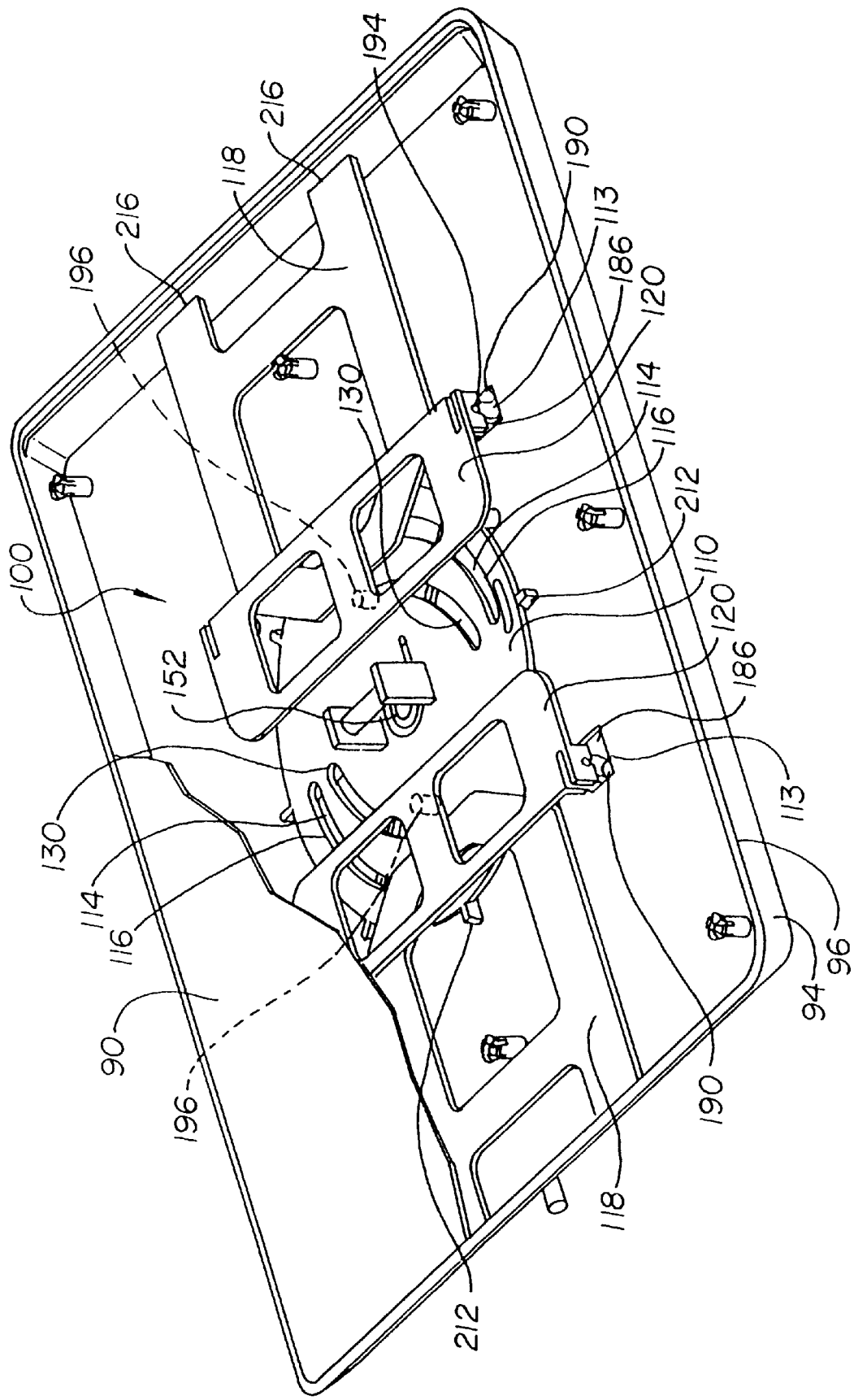
FIG. 2 is a perspective view of the wafer container door with a portion of the front cover removed exposing the mechanism.

FIG. 2 shows a perspective view of the door 20 with a portion of the front cover 86 removed revealing the door mechanism 100 which includes the latching mechanism 101 as well as the wafer retaining mechanism 102, both of which share components. Individual components of the door mechanism are shown in FIGS. 3, 4, 5, and 6 and comprise a rotatable cammed member 110, a wafer engaging arm 112 with attached bell cranks 113 and a latching arm 118 and a wafer engaging arm actuator link 120.

Figure 3:
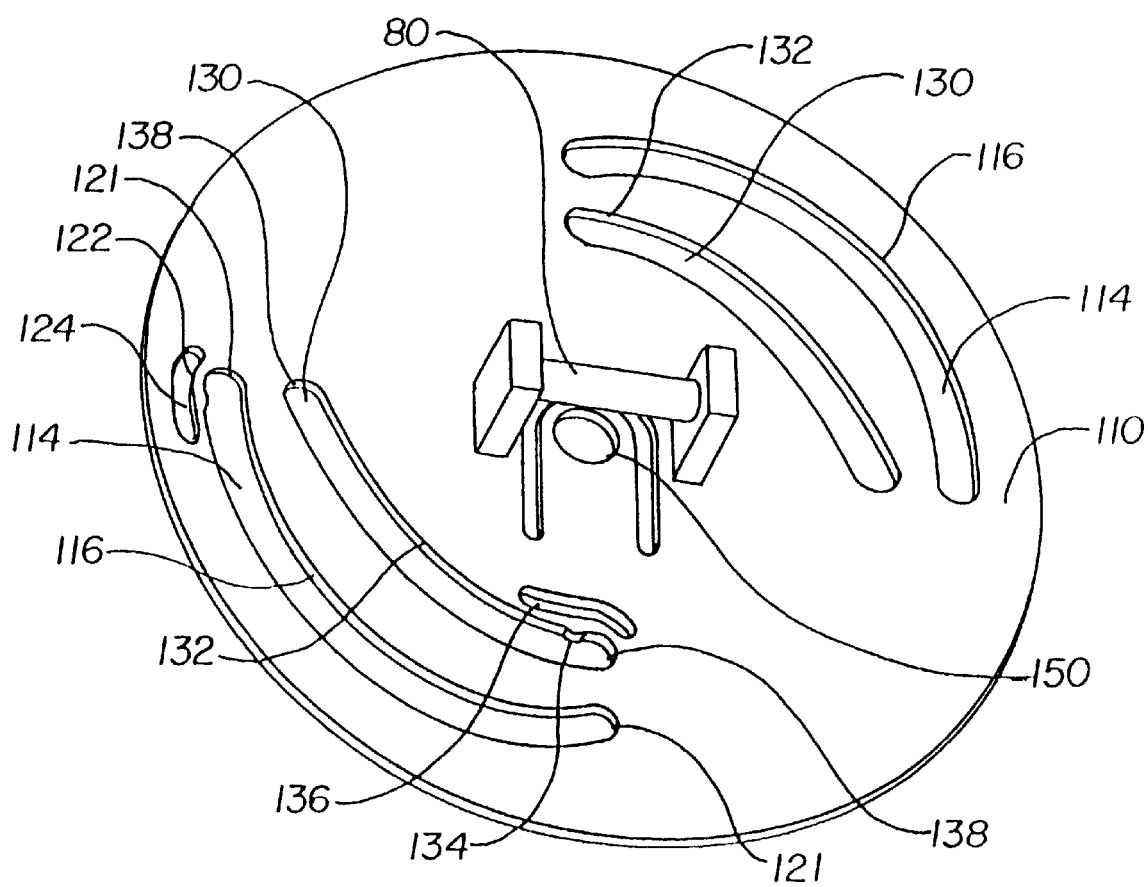
FIG. 3 is a perspective view of the rotatable cam member.

Referring to FIGS. 2 and 3, the rotatable cammed member 110 has a pair of latching arm cam apertures 114 forming cam surfaces 116. The cam apertures 114 have opposing ends 123 with a detent 122 formed at an end by way of a protrusion of plastic. The detent 122 is made flexibly resilient by the addition of a detent aperture 124. The rotatable cam member 110 also has a pair of opposite wafer engaging cam apertures 130 which forms a wafer engaging cammed surfaces 132. Further a wafer engaging cam detent 134 is provided by a protrusion in one of the cam surfaces 132 and is made resiliently flexible by way of a detent aperture 136 adjacent an end 138 of the wafer engaging cam aperture 130. The rotatable cam member has a central bore 150 used to position and secure the rotatable cammed member 110 onto the rear panel 96 of the door by shaft 152.

Figure 4:
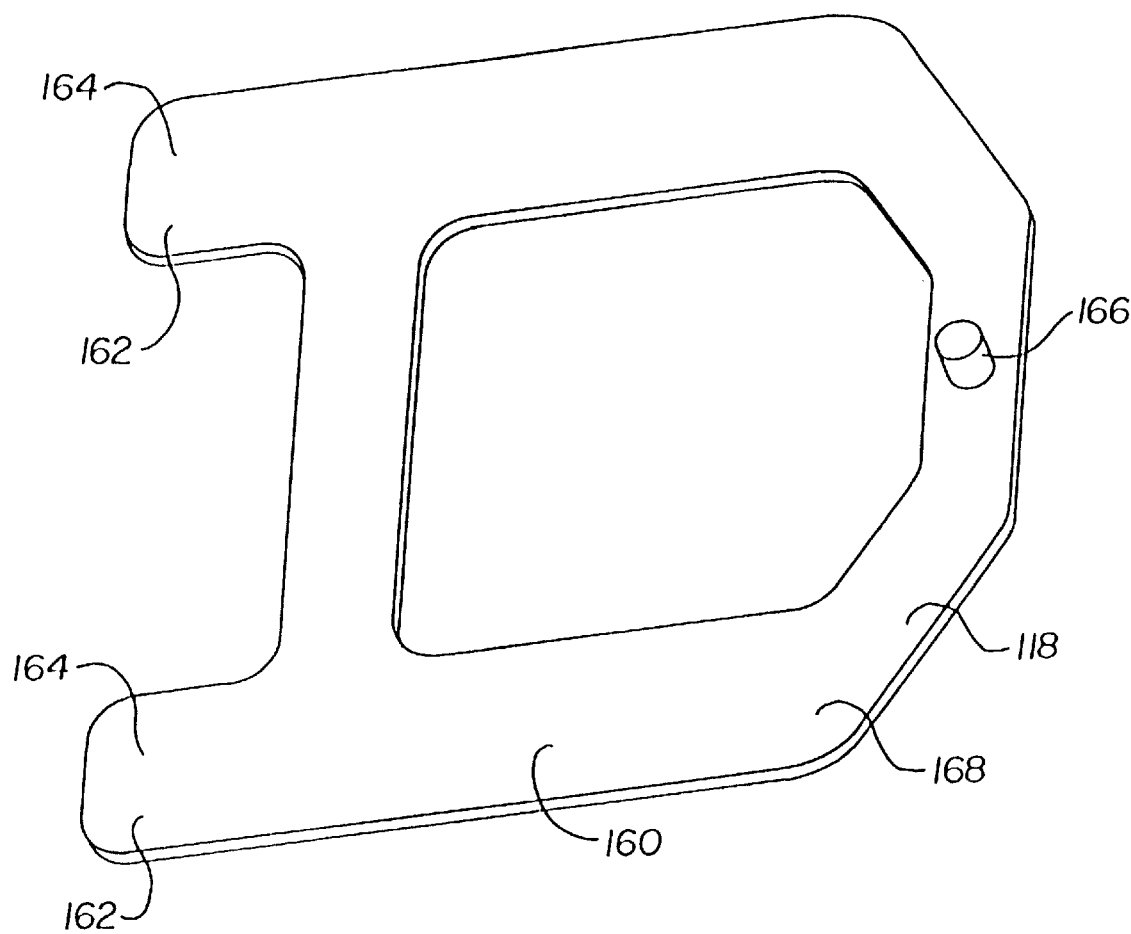
FIG. 4 is a perspective view of a latching arm.

Referring to FIGS. 2 and 4, each latching arm 118 comprises a linking portion 160 and a pair of extendable portions 162 which include a latching portion 164 which is configured to engage in the recesses or apertures 72, 74 in the door receiving frame 60. Each latching arm also has a cam follower 166 formed as a shaft or projection from the generally planar portion 168 of the arm 118.

Figure 5:
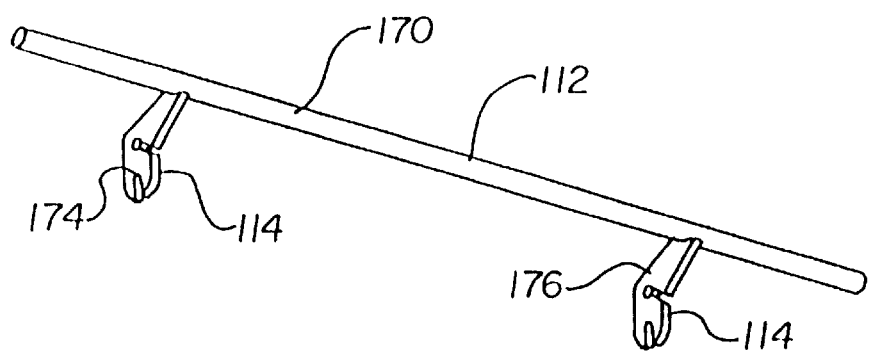
FIG. 5 is a perspective view of a wafer engaging arm.
Figure 7:
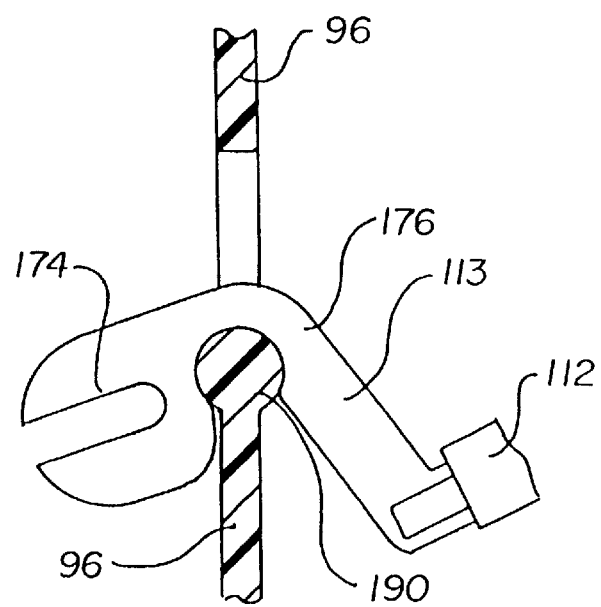
FIG. 7 is a cross-sectional view of a bell crank engaged with rear panel.
Figure 10B:
FIG. 10B is a schematic view illustrating the position of the wafer engaging arms.
Figure 10A:
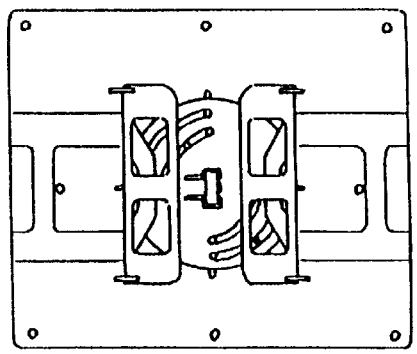
FIG. 10A is a schematic view of the door in a closed position.

Referring to FIGS. 5, 7, and 8, each wafer engaging arm 112 is comprised of a wafer edge engaging portion 170, the bell cranks 113 with a connecting slot 174 and a pivot surface 176. The wafer edge engaging portion 170 is suitable formed of Hytrel.

Figure 6:
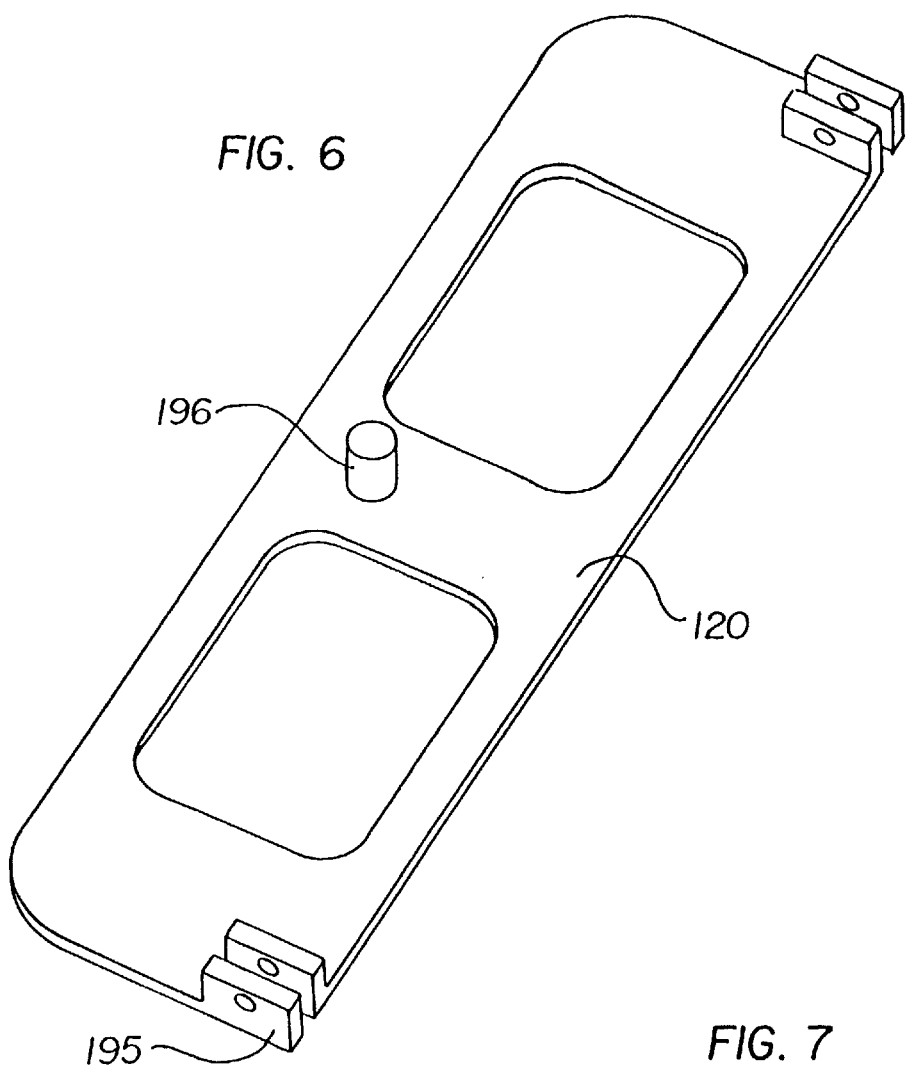
FIG. 6 is a perspective view of a wafer engaging arm actuator link.

Referring to FIG. 6 the wafer engaging arm actuator link 120 is shown and has a cam follower 196 and hinges 195.

The latching arms 118 are positioned between the rotatable cammed member 110 and the actuator link 120. The latching portions are sized to slidably extend and retract through the slots 216 in the door edge portion 94. The cam followers 166 extend into the can follower aperture 118 and further into the back panel groove 200. The top cover is assembled on the door edge portion 94 to form the door enclosure 90. The relatively limited space between the front panel and back panel operate to stabilize and retain the mechanism 100.

The component parts are assembled as follows. Referring to FIGS. 2 and 9, the rear panel 96 of the door has four apertures 186 aligned as the corners of a rectangle. The rear panel has four cylindrically shaped pin members 190 positioned at each of the apertures and integral with the rear panel 96. The pin members 190 are appropriately sized to snap fit within the bell crank 113 to allow the rotation of the bell crank 113 on the pin member 190. The slot 174 of the bell crank 113 engages with the engaging arm actuator link 120 by way of a pin 194 in hinge 195. Each actuator link 120 has the cam follower 196 which engages with the wafer engaging arm cam surfaces 132 and also engage within recesses or grooves 200 formed in the rear panel 96. Said grooves are formed within raised projections 202 extending upwardly from the rear panel toward the front panel. Also extending upwardly from the rear panel 96 are a plurality of rotatable cam member support bars 210 upon which the rotatable cam members 80 rides. Said bars may have lugs 212 to facilitate holding the table cam member 110 in place. The embodiment of FIG. 7 utilizes slots 186 rather than the generally square apertures as shown in FIG. 2. Additionally, the pins 190 are positioned centrally in the slot 186 as opposed to the side of the aperture shown in FIG. 2.

Figure 11B:
FIG. 11B is a schematic view of the wafer engagement arms in a proximal position not engaging the wafers corresponding to the mechanism position of FIG. 11A.
Figure 11A:
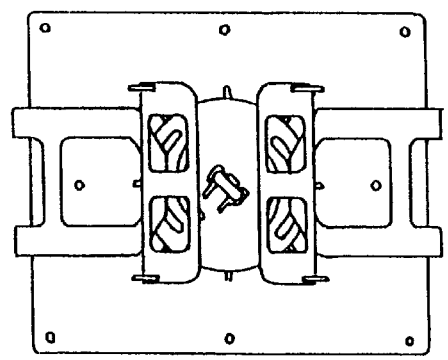
FIG. 11A is a schematic view of the door mechanism with the latching arms extended.
Figure 12B:
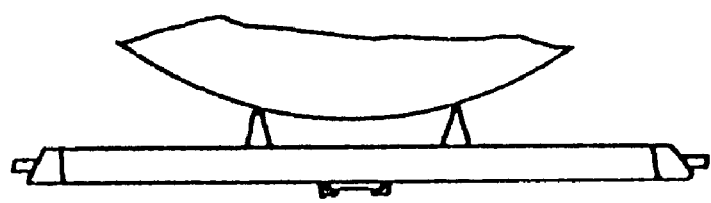
FIG. 12B is a schematic view corresponding to the mechanism position of FIG. 12A with the wafer engaging arms distally positioned engaging the wafers.
Figure 12A:
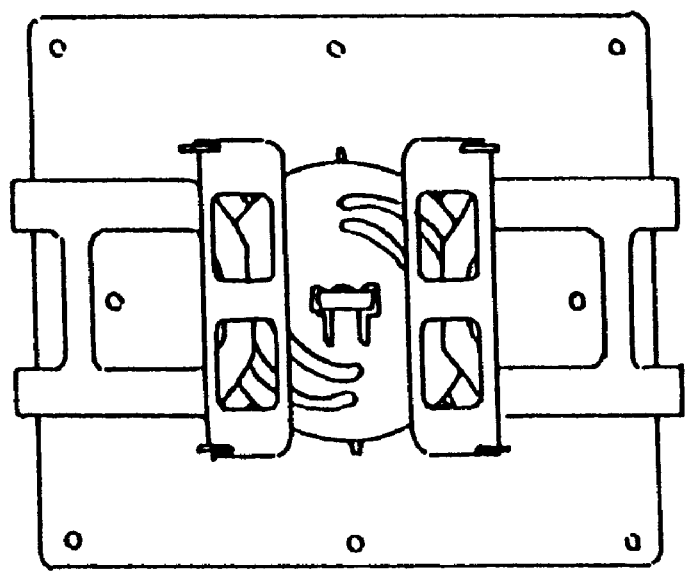
FIG. 12A is a schematic view of the mechanism in a fully latched position with the latching arms extended.
Figure 13B:
FIG. 13B corresponds to the mechanism position of FIG. 13A with the wafer engaging arms disengaged from the wafers in their proximal position.
Figure 13A:
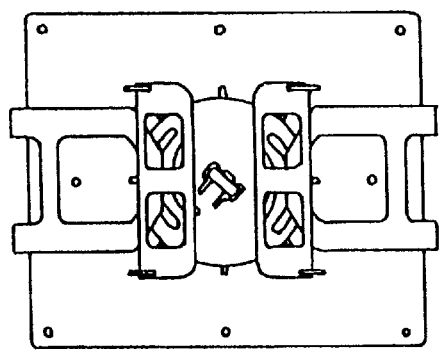
FIG. 13A is a schematic view of the door during an opening procedure with the latching arms fully extended.
Figure 14B:
FIG. 14B corresponds to the mechanism position of FIG. 14A and shows the wafer engaging arms remaining disengaged from the wafers.
Figure 14A:
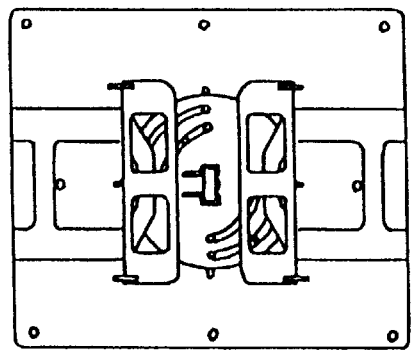
FIG. 14A is a schematic view of the door with the wafer mechanism returned to the fully unlatched position for opening said door.

The device operates as follows. Referring to FIG. 2 and the series of figures from FIGS. 10A and 10B through FIGS. 14A and 14B, the door is first placed within the door receiving frame 60 of the container portion 22 by way of manual or robotic means. The rotatable cammed member is rotated in a counter-clockwise configuration for the embodiment of FIG. 2. The engagement of the cam follower 166 of the latching arm with the cam surfaces 116 in the rotatable cammed member cause the latching arm to slidably extend outwardly due to the particularized shape of said cam aperture 114. As the latching arm 118 extends outwardly the latching portions 164 extend through the apertures 216 and into the slots 72, 74 on the vertical frame members of the door receiving frame 60. See specifically FIG. 11A. The wafer engaging arms are not extended at this point. Further rotation of the cammed wafer portion as shown in FIG. 12A does not further significantly move the latching arm 118 but does urge the cam followers 196 of the wafer engaging arm actuator links 120 outwardly thereby rotating the bell cranks 113 to translate the lateral motion of the actuator link 120 into an outward motion of the wafer engaging arm 112 toward the wafers. FIG. 12B thus shows the wafer engaging arms in a distal position with respect to the door enclosure and in a wafer engagement position. With the cam member rotated a full 90° counter-clockwise the cam followers 196 and 166 are moved past the detents 134, 122 thereby locking the cammed member in said position of FIGS. 12A and 12B. To unlatch and remove said door the cam member is rotated clockwise, first into the position as shown in FIGS. 13A and 13B in which the wafer engaging arms 112 are retracted away from the wafers and then to proximal position as shown in FIGS. 13A and 13B where the latching arms 118 also are retracted out of the slots in the door receiving frame.

FIG. 15 shows an alternative embodiment of the invention in which the means for extending and retracting the latching portions and the means for moving the wafer engaging member between a proximal and distal position comprise linkages 211, 212 and joints 213 rather than the cam surfaces and cam followers. In such a configuration, the rotatable member 110 can be locked into the latching position by way of an overcenter position of link 212 as shown by the dotted lines labelled with the numeral 216. In the particle configuration shown in this figure, full actuation of the latching arm and wafer engaging arm are achieved with approximately ⅛ of a rotation of the rotatable member 110. The arrow 219 indicates the direction of rotation to fully extend the latching arms 118 and the wafer engaging arm 112, not shown in this view.

The individual parts of the door mechanism 100 may be suitably formed of carbon fiber polycarbonate to provide a static dissipative characteristic. The front panel and rear panel of the door may be formed of polycarbonate.

Referring to FIGS. 15, 16, 17, 18A, 18B, 19A, 19B, and 20, a transport module with an alternate latching and wafer retention mechanism generally designated with the numeral 220 is shown and is principally comprised of a container portion 222 and a cooperating door 224. The container portion generally has an open front 240, a closed top 242, a closed left side 244, a closed back side 246, a closed right side 248 and a closed bottom 250. The bottom 250 also includes a machine interface 252. The container portion 222 includes a plurality of wafers W axially aligned with the planes of the wafers substantially horizontal. Container portion 222 has a generally rectangular door frame 260 with two pairs of opposing frame members including a pair of vertical members 264 and a pair of horizontal members 268. The horizontal members 268 each have two latch receptacles 272, 274 each of which includes slot 275. The latch receptacles are utilized in engaging, latching, and sealing the door to the container portion 222. The door has a pair of key holes 278 utilized for accessing the internal latching mechanism, not shown in this view. The door 224 comprises a pair of outwardly facing panels including a left panel 285 and a right panel 286. The door has an edge portion 294 which includes an outer periphery forming a door seating portion 295 which is engageable within the door frame 260. The outwardly facing panels 285, 286 also have apertures 296 which form part of a latch indicator 297. The door edge portion includes four openings configured as slots 299 positioned on the door edge portion 294.

Figure 16:
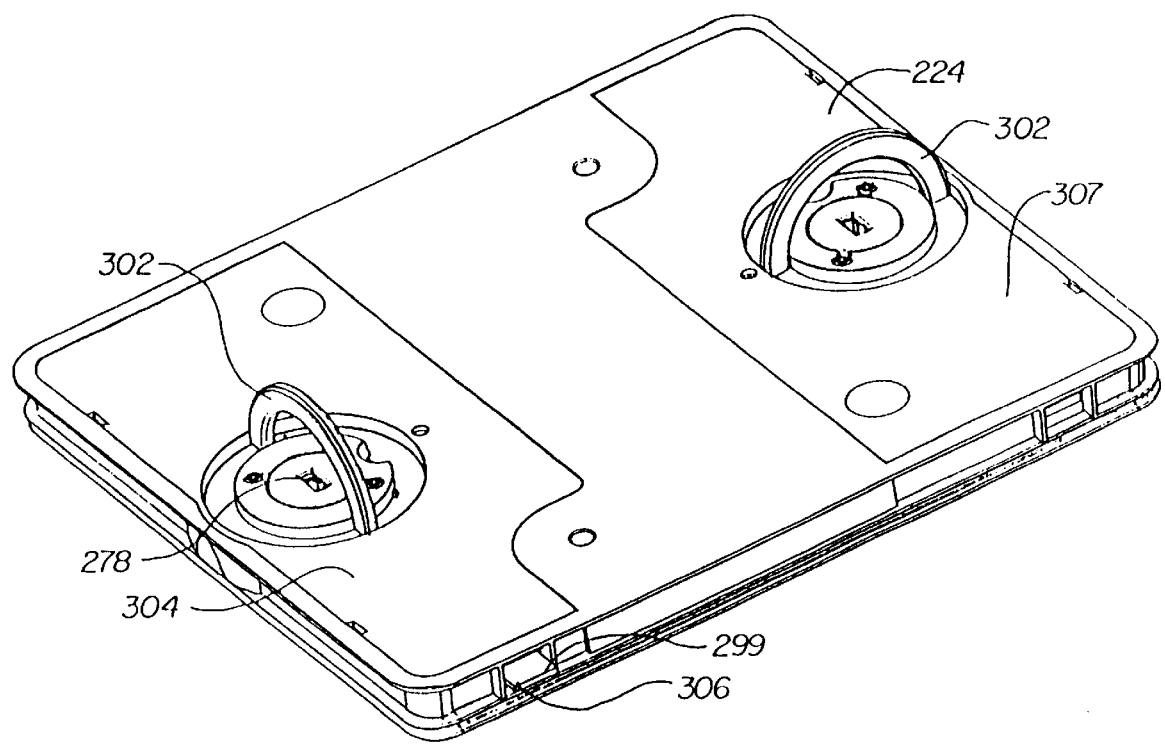
FIG. 16 is a perspective view of an alternate embodiment of the door of FIG. 15 utilizing manual handles.
Figure 17:
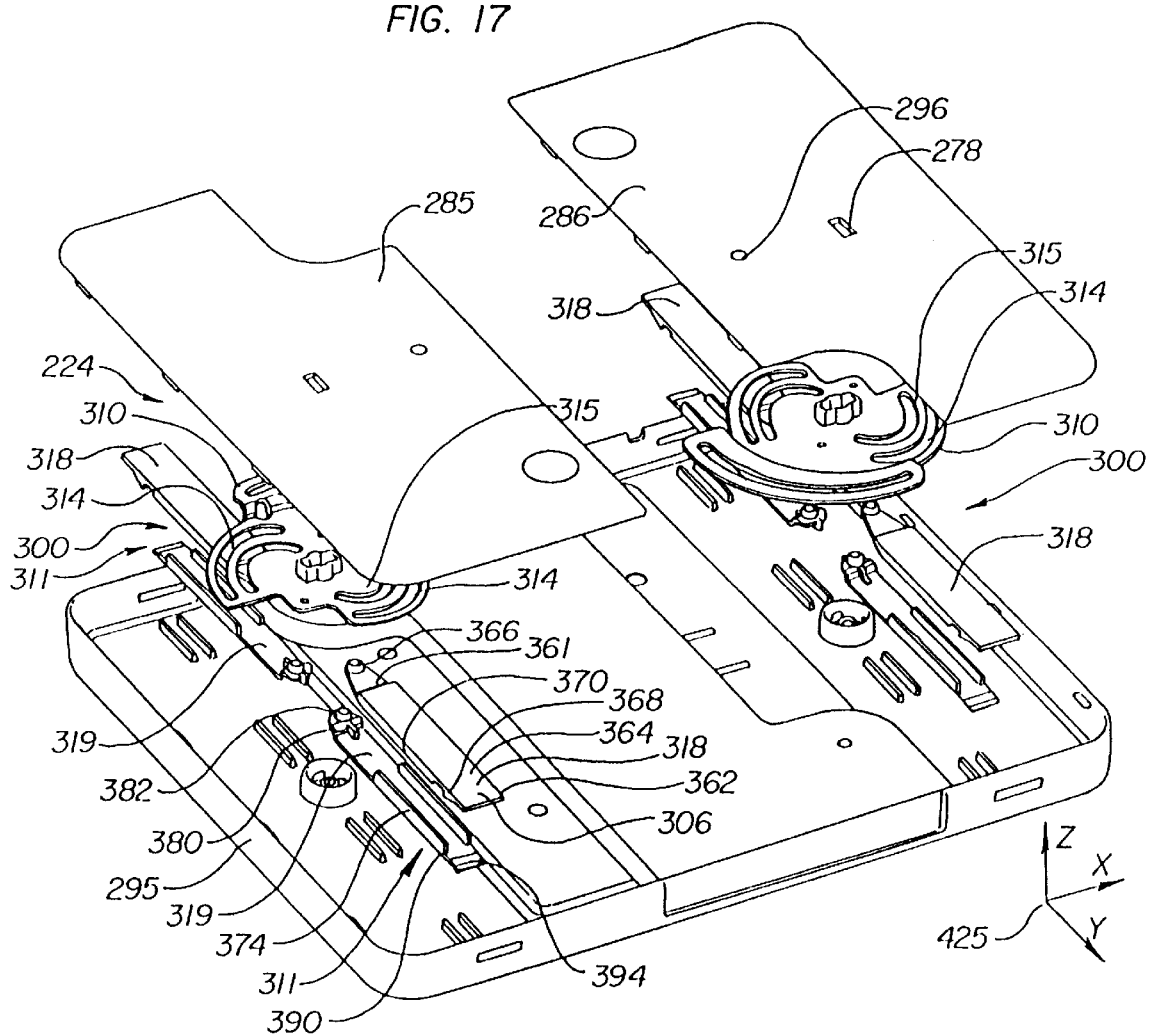
FIG. 17 perspective blow-up view of the door of FIG. 15 revealing the latching mechanisms.

Referring to FIGS. 16, 17, and 20, the door 224 with the latching mechanisms is shown in detail. FIG. 16 shows an alternative configuration in which the key holes 278 are supplemented by way of manually operatable handles 302. Note that the left side 304 of the door has a latch portion 306 extending from the slot 299. The right side 307 has the handle in a horizontal position corresponding to a retracted latch portion. Referring to FIG. 17 a exploded view of the door 224 is shown revealing the internal latching mechanisms 300. Each latching mechanism 300 is comprised of a rotatable cammed member 310 and two sets 311 of latching linkages. The rotatable cammed member 310 has a pair of first cam guides 314 configured as slots 314 and a pair of second cam guides 315 also configured as apertures or slots in the cammed wheel. The sets 311 of latching linkages 311 are each comprised of a latching arm or linkage 318 and a lifting arm or linkage 319. When used herein "linkage" would include a segmented member or two or more separate pieces connected together.

Each latching linkage 318 has generally rectangular planar portion 359, two ends 361, 362 with the distally located end 362 comprising the latching portion 306. The end 361 proximal to the rotatable cammed member 210 has a cam follower 366 and a first lifting portion 368 intermediate the two ends. The latching linkage has lower side guides 370 for engaging the respective latching linkage 318.

Each lifting linkage 319 has a pair of upper side guides 374 which engage with the lower side guides 370 of the latching linkage 318 to generally restrain lateral movement of the linkages 318, 319. The lifting linkage 319 has a proximal end 380 with a cam follower 382 and an opposite end 390 which includes an additional cam surface configured as a ramp 394.

Referring to FIGS. 18A, 18B, 19A, 19B, and 21, details of the operation of the latching mechanisms 300 are revealed. When the door is displaced from the container portion 222 as shown in FIG. 1, the latching portion 306 will typically be retracted inside the door enclosure 404 and as shown specifically in FIGS. 18A and FIG. 18B. Note that FIG. 18A and 19A correspond to a front view of the right side 307 of the door with the right panel 286 removed. FIG. 18A and 18B show the latches in the fully retracted position. Rotation of the cammed member 310 by use of a key inserted in the key hole or by way of the manual handles 302 causes a clockwise rotation of the camned member 310. The first cam guide 314 and second cam guide 315 are radially spaced equally from each other for the first approximately 22½° of rotation. During this first partial rotation each set 311 of linkages move together from the position as shown in FIG. 18B to that shown in FIG. 21. During the next 22½° of rotation of the cammed wheel the latching linkage 318 remains relatively fixed with the first cammed guide 314 having a relatively fixed radially distance from the center of the cammed wheel through this second 22½° arc. Through the first 22½° arc 411 the latching linkage 318 is extended outwardly with respect to the door in a first direction indicated by the arrow enumerated with the number 414 which corresponds to the "y" axis on the coordinate system 425. During the second 22½° arc 412 the lifting linkage 319 moves from the position as shown in FIG. 21 to that shown in FIG. 19B and moves the latching portion 306 of the latching linkage 318 in a second direction as indicated by the arrow with the numeral 415. The second direction 415 corresponds to the "z" axis. When this happens the door is urged inwardly with respect to the container portion creating a secure seal between the door frame 260 and the door edge portion 294 specifically the elastomeric ring 420.

Referring to FIG. 19A note that the indicator aperture 430 which is part of the latch indicator 297 is positioned immediately to the left of the axis 434 of the cammed wheel. This corresponds to the position of the aperture 296 in the right front panel 286 as shown in FIG. 17. Thus, when the cammed wheel is in a fully clockwise rotational position and the latching portions 306 are in a fully extended and inwardly pulled position as shown in FIG. 21 the aperture 430 is lined up with the aperture 296 providing a visual indication that the door is in said full latch position.

Note that the cammed wheel is shown in FIGS. 18A, 18B, 19A, 19B and 17 depict an additional fifth cam guide way 440 on each slot. This corresponds to the option of adding an active wafer restraining device as previously discussed and shown in FIGS. 2–15. Additionally, an alternative embodiment of an active wafer restraint system will be disclosed.

Referring to FIG. 22 the integrally facing side 460 of the door 224 is shown. Extending from the surface 462 of the door are a pair of wafer restraints 470. The restraints as configured could be used in a passive fashion simply secured to the door or alternatively used in an active manner such that they are extendable inwardly towards the interior of the door and back outwardly towards the door. One mechanism for accomplishing such motion is shown in FIGS. 22–26. Referencing FIG. 23 the fifth cam guide 440 is engaging a cam follower 474 which is part of a sliding bar 476. The bar 476 is engaged with guides 479 which are integral with the door enclosure 404. Guides 482 on the back surface of the bar 476 engage with the guides 479 on the enclosure.

The sliding bar 476 includes cam guides 486 which engages with a cam follower 490 which is attached to a piston 494 which extends through an aperture 500 in the door enclosure 404 and engages specifically with a bushing 504 and is further sealed with an o-ring 506. The sliding bars 476 further restrain by way of the outwardly facing left panel 285 of the door 224.

Figure 23:
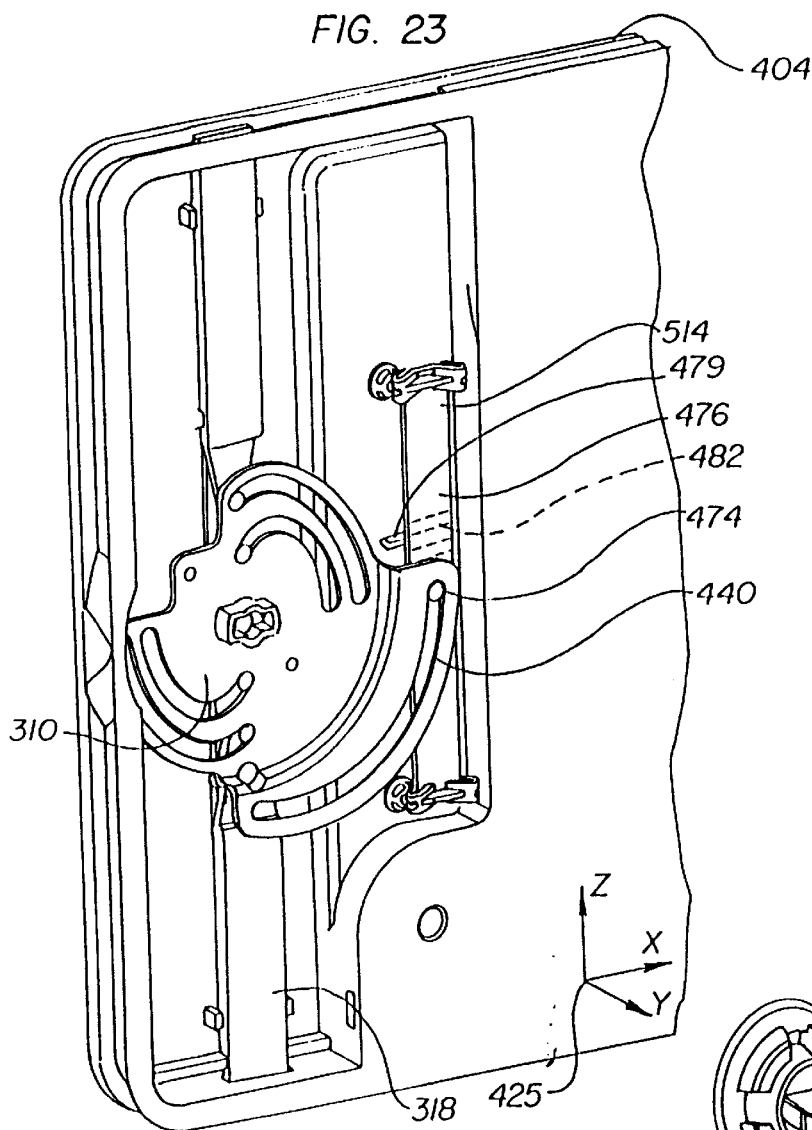
FIG. 23 is a perspective view of the front side of the door with the door panels removed revealing the latching mechanism and a further embodiment of an active wafer restraint mechanism.
Figure 26:
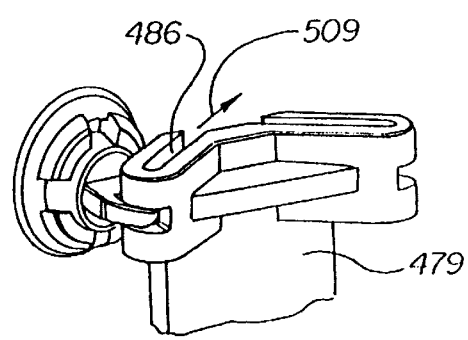
FIG. 26 shows a detailed perspective view of a portion of the sliding bar.
Figure 24:
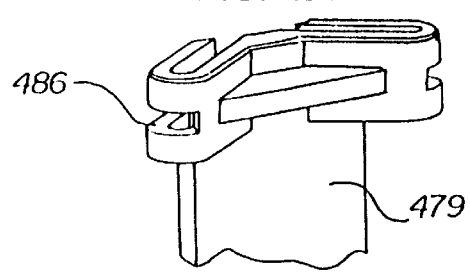
FIG. 24 is a detailed perspective view of the sliding bar in engagement with the piston.

As the cammed member 310 is rotated clockwise from the position as shown in FIG. 23 the sliding bar is pulled to the left opposite the "x" direction which causes the cam follower 490 to slide down the cam guide 486 in the direction as shown by the arrow 509. This corresponds to a movement of the piston towards the inside of the container portion and thus the wafer restraints which are engaged with the pistons which move towards and engage the wafers as the door is being secured to the container portion. The sliding bars 476 and cam guide 486 and cam follower 490 are part of a motion translation mechanism 514.

Alternately the crank arrangement as discussed in the earlier embodiments also would be appropriate for utilization.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

We claim:

1. A wafer transport module comprising:
   a) a container portion for holding wafers, the container portion having an open interior and a generally rectangular door frame defining a door opening, the door frame having a latch receptacle;
   b) a door placeable in the door frame to cover the door opening, the door having an open interior and comprising:
      i) an outer seating portion sized for engaging with the generally rectangular door frame, the outer seating portion having a opening corresponding to the latch receptacle when the door is placed in the door frame;
      ii) a cammed member in the open interior at least partially rotatable, the cammed member partially rotatable from exterior of the door and having a first cam guide and a second cam guide;
      iii) a latch linkage with two ends, one end having a cam follower engaged to the first cam guide and the other end having a latch portion extending to the opening in the outer seating portion, the latch linkage having a first lifting portion intermediate the two ends, the first cam guide configured to extend the latch portion outwardly with respect to the door in a first direction into the latch receptacle; and
      iv) a lifting linkage with a cammed end having a cam follower engaged to the second cam guide, the lifting linkage having a cooperating second lifting portion engageable with said first lifting portion, the first lifting portion and the second lifting portion arranged in an overlapping relationship, one of said first lifting portion and said second lifting portion having a ramp portion and the other of said first lifting portion and said second lifting portion having a ramp engagement surface, the second cam guide configured to move the lifting linkage with respect to the latch linkage whereby the ramp engagement portion rides on the ramp to move the latch linkage in a second direction substantially normal to the first direction when the latching portion is in the latch receptacle.

2. The transport module of claim 1 wherein the door further comprises a wafer retainer mounted to the door for engaging and restraining the wafers.

3. The transport module of claim 2 wherein the cammed member further comprises a wafer engagement cam guide, and wherein the wafer retainer is movably mounted to the door and moveable toward and away from the open interior, and a motion translation linkage extending between the wafer retainer and the wafer engagement cam guide, the motion translation linkage configured such that rotation of the cammed member extends the wafer retainer outwardly.

4. The transport module of claim 1 further comprising a wafer engaging mechanism comprising an inwardly and outwardly moveable wafer engaging arm and an actuator arm connecting to the wafer engaging arm, the actuator arm having a cam follower engaged with the wafer engagement cam guide, whereby when the cammed member is rotated the actuator arm extends the wafer engaging arm outwardly to engage the edge portions of the wafers thereby retaining said wafers.

5. The transport module of claim 1 further comprising a active wafer retaining mechanism with the door.

6. The transport module of claim 1 further comprising a active wafer retaining means with the door, said retaining means engaged with the cammed member.

7. A transport module for wafers comprising a container portion with a door opening and a door sized to close said door opening and to be received thereby, the container portion having a latching slot adjacent to the door opening, the door comprised of:
   a) a door enclosure with a periphery, an open interior, and a slot at the periphery, the slot positioned adjacent the receiving slot when the door;
   b) a partially rotatable member controllable from exterior the enclosure and rotatably mounted inside the enclosure;
   c) a latching linkage positioned inside the enclosure with a first end connecting to the rotatable member and a second end extendable outwardly in a first direction through said slot as the rotatable member partially rotates, the latching linkage having a lifting portion positioned intermediate the first end and the second end; and
   d) a lifting linkage with a first end connecting to the rotatable member and a second cooperative lifting portion positioned adjacent the first lifting portion, the second lifting portion moveable in a direction parallel to the first direction, one of the first lifting portion and the second lifting portion having a ramp and the other having a ramp engagement portion whereby when the second lifting portion moves with respect to the first lifting portion the ramp engagement portion rides on the ramp and the lifting linkage is moved in a second direction substantially normal to the first direction.

8. The transport module of claim 7 wherein the door further comprises a wafer retainer mounted to the door for engaging and restraining the wafers.

9. The transport module of claim 8 wherein the cammed member further comprises a wafer engagement cam guide, and wherein the wafer retainer is movably mounted to the door and moveable toward and away from the open interior, and a motion translation linkage extending between the wafer retainer and the wafer engagement cam guide, the motion translation linkage configured such that rotation of the cammed member extends the wafer retainer outwardly.

10. The transport module of claim 7 further comprising a wafer engaging mechanism comprising an inwardly and outwardly moveable wafer engaging arm and an actuator arm connecting to the wafer engaging arm, the actuator arm having a cam follower engaged with the wafer engagement cam guide, whereby when the cammed member is rotated the actuator arm extends the wafer engaging arm outwardly to engage the edge portions of the wafers thereby retaining said wafers.

11. The transport module of claim 9 further comprising an active wafer retaining mechanism with the door.

12. The transport module of claim 9 further comprising an active wafer retaining means with the door, said retaining means engaged with the cammed member.

13. A transport module comprising a door and a container portion, the container portion having a front side, a closed left side, a closed right side, a closed top, a closed bottom with an equipment interface, a closed back side, an open interior, a plurality of wafer support columns in the interior for holding wafers in a stacked axially aligned arrangement, and a door frame on the front side leading to the open interior, the door frame having four latch receptacles, the door having a periphery sized for said door frame, a left side with an open interior and a right side with an open interior, the left side having a pair of latching slots alignable with respective latching receptacles on the door frame, the right side having an additional pair of latching slots alignable with respective latching receptacles on the door frame, the door further comprising on each of the left side and the right side a rotatable cammed member and two sets of latching linkages in each of the respective open interiors, each rotatable member having two sets of cam guides with a set of latching linkages corresponding to and engaged with each set of cam guides, each set of latching linkages comprising a first latching linkage engaged with the first cam guide and extending to one of the latching slots, and a cooperating lifting linkage extending parallel to said first latching linkage, the lifting linkage having a ramped portion and the latching linkage having a ramp engaging portion, the cam guides configured such that when the door is in the door frame and when the rotatable portion is rotated through a first arc, the lifting linkage moves outward in a first direction through the latching slot into the corresponding latching receptacle and the lifting linkage moves substantially there along, whereby when the rotatable portion is moved through a second adjacent arc the latching linkage remains relatively still with respect to said first direction and the lifting linkage moves with respect to said latching linkage whereby the ramp wedges under the ramp engagement portion and the latching arm is urged in a second direction substantially normal to the first direction.

14. A wafer transport module comprising:
 a) a container portion for holding wafers, the container portion having a generally rectangular door frame defining a door opening, the door frame having a latch receptacle;
 b) a door placeable in the door frame to cover the door opening, the door having an open interior and comprising:
  i) an enclosure having an inner facing panel and an outer facing panel, an outer seating portion sized for engaging with the generally rectangular door frame, the outer seating portion having a opening adjacent to the latch receptacle when the door is placed in the door frame;
  ii) a cammed member in the open interior at least partially rotatable from exterior of the door and having a first cam guide and a second cam guide;
  iii) a latch linkage with two ends, one end having a cam follower engaged to the first cam guide and the other end having a latch portion extending to the opening in the outer seating portion, the lifting linkage having a first lifting portion intermediate the two ends, the first cam guide configured to extend the latch portion outwardly with respect to the door in a first direction into the latch receptacle; and
  iv) a lifting linkage with a cammed end having a cam follower engaged to the second cam guide, the lifting linkage having a cooperating second lifting portion engageable with said first lifting portion, the first lifting portion and the second lifting portion arranged in an overlapping relationship, one of said first lifting portion and said second lifting portion having a ramp and the other of said first lifting portion and said second lifting portion having a ramp engagement surface, the second cam guide configured to move the lifting linkage with respect to the latch linkage whereby the ramp engagement portion rides on the ramp to move the latch linkage in a second direction substantially normal to the first direction when the latching portion is in the latch receptacle.

15. The transport module of claim 14 wherein the door further comprises a wafer retainer mounted to the door for engaging and restraining the wafers.

16. The transport module of claim 15 wherein the cammed member further comprises a wafer engagement cam guide, and wherein the wafer retainer is movably mounted to the door and moveable toward and away from the open interior, and a motion translation linkage extending between the wafer retainer and the wafer engagement cam guide, the motion translation linkage configured such that rotation of the cammed member extends the wafer retainer outwardly.

17. The transport module of claim 14 further comprising a wafer engaging mechanism comprising an inwardly and outwardly moveable wafer engaging arm and an actuator arm connecting to the wafer engaging arm, the actuator arm having a cam follower engaged with the wafer engagement cam guide, whereby when the cammed member is rotated the actuator arm extends the wafer engaging arm outwardly to engage the edge portions of the wafers thereby retaining said wafers.

18. The transport module of claim 14 further comprising an active wafer retaining mechanism with the door.

19. The transport module of claim 14 further comprising a active wafer retaining means with the door, said retaining means engaged with the cammed member.

20. A wafer transport module comprising:
   a) a container portion for holding wafers in a horizontal arrangement, the container portion having an open front and a latch receptacle on the container portion at the open front; and
   b) a door placeable to close the open front, the door comprising:
      i) a latching linkage having a latching portion extendable outwardly in a first direction towards the latch receptacle; and
      ii) a lifting linkage adjacent the latch linkage and moveable in a direction substantially parallel to the first direction, at least one of the lifting linkage and the latching linkage having a ramp such that when the other of the lifting linkage and the latching portion moves with respect to the ramp, the ramp causes the latching linkage to be moved in a second direction substantially normal to the first direction.

21. The wafer transport module of claim 20, wherein said door further comprises: an outer seating portion sized for closing the open front of the container portion, the seating portion having an opening aligned with the latch receptacle when the door is placed to close the container portion; an open interior; and a cammed member in the open interior at least partially rotatable from exterior of the door and having first and second cam guides; the latching linkage further comprises a cam follower engaged to the first cam guide, the first cam guide configured to extend the latch portion in the first direction through the opening of the outer seating and into the latch receptacle; the lifting linkage further comprises a cammed end having a cam follower engaged to the second cam guide, the second cam guide configured to move the lifting linkage with respect to the latch linkage in substantially the first direction.

22. The transport module of claim 20, wherein the door further comprises a wafer retainer mounted to the door for engaging and restraining the wafers.

23. The transport module of claim 20, wherein the door further comprises an active wafer restraining mechanism.

24. The transport module of claim 20, wherein the ramp is integral with one of the lifting linkage and the latching linkage.

25. A wafer transport module comprising:
   a) a container portion for holding wafers in a horizontal arrangement, the container portion having an open front and a latch receptacle on the container portion at the open front; and
   b) a door placeable to close the open front, the door having a latching mechanism comprising:
      i) a latching linkage having a latching portion moveable in a first direction, whereby the latching portion may be moved into and out of the latch receptacle;
      ii) a lifting linkage slideably engaging the latching linkage; and
      iii) a ramp connected to one of the latching linkage and the lifting linkage, wherein when the lifting linkage moves parallel to the latching linkage the other of the latching linkage and the lifting linkage engages the ramp, whereby the latching portion is guided in a second direction, substantially normal to the first direction.

26. The wafer transport module of claim 25, wherein the ramp is integral with one of the latching linkage and the lifting linkage.

27. The wafer transport module of claim 25, wherein said door further comprises: an outer seating portion sized for closing the open front of the container portion, the seating portion having an opening aligned with the latch receptacle when the door is placed to close the container portion; an open interior; and a cammed member in the open interior at least partially rotatable from exterior of the door and having first and second cam guides; the latching linkage further comprises a cam follower engaged to the first cam guide, the first cam guide configured to extend the latch portion in the first direction through the opening of the outer seating and into the latch receptacle; the lifting linkage further comprises a cammed end having a cam follower engaged to the second cam guide, the second cam guide configured to move the lifting linkage with respect to the latch linkage in substantially the first direction.

28. The transport module of claim 25, wherein the door further comprises an active wafer restraining mechanism.

* * * * *

UNITED STATES PATENT AND TRADEMARK OFFICE
CERTIFICATE OF CORRECTION

PATENT NO. : 5,915,562
DATED : June 29, 1999
INVENTOR(S) : David L. Nyseth and Dennis J. Krampotich Page 1 of 1

It is certified that error appears in the above-identified patent and that said Letters Patent is hereby corrected as shown below:

Abstract:
Line 12, please delete the word "if" and insert in its place -- of --.

Column 1,
Line 52, after the word "desired" please insert --,--.

Column 2,
Line 64, please delete the "," after the word "is".

Column 5,
Line 19, please delete the word "particle" and insert in its place -- particular --.

Column 6,
Line 14, after the numeral "368" please insert -- configured as a ramp engagement portion --.
Line 20, rewrite the sentence beginning "The lifting linkage 319" as -- The lifting linkage 319 has a proximal end 380 with a cam follower 382 and an opposite end 390 which includes a cooperative second lifting portion 394, configured as a ramp. The first and second lifting portions comprise a deflecting means for deflecting the latching portion 306. --

Signed and Sealed this

Seventh Day of August, 2001

*Attest:*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO. : 5,915,562
DATED : June 29, 1999
INVENTOR(S) : David L. Nyseth and Dennis J. Krampotich It is certified that error appears in the above-identified patent and that said Letters Patent is hereby corrected as shown below:

<u>Column 8,</u>
Line 54, after the word "door" please insert -- is positioned in the door opening --.

Signed and Sealed this

Eleventh Day of June, 2002

*Attest:*

*Attesting Officer*

JAMES E. ROGAN
*Director of the United States Patent and Trademark Office*